United States Patent [19]

Fitzpatrick et al.

[11] Patent Number: 4,868,427
[45] Date of Patent: Sep. 19, 1989

[54] ECL TO TTL CIRCUIT

[75] Inventors: Mark E. Fitzpatrick; Yat-Sum Chan, both of San Jose; Gary R. Gouldsberry, Cupertino, all of Calif.

[73] Assignee: Gazelle Microcircuits, Inc., Santa Clara, Calif.

[21] Appl. No.: 115,144

[22] Filed: Oct. 30, 1987

[51] Int. Cl.[4] .................. H03K 19/092; H03K 19/088
[52] U.S. Cl. ................................ 307/475; 307/455; 307/456
[58] Field of Search ............... 307/475, 270, 455, 456

[56] References Cited

U.S. PATENT DOCUMENTS

| | | | |
|---|---|---|---|
| 3,766,406 | 10/1973 | Bryant et al. | 307/475 |
| 3,959,666 | 5/1976 | Fett et al. | 307/475 |
| 4,514,651 | 4/1985 | Miller et al. | 307/475 |
| 4,644,194 | 2/1987 | Birrittella et al. | 307/443 |
| 4,678,944 | 7/1987 | Williams | 307/443 |
| 4,697,110 | 9/1987 | Masuda et al. | 307/475 |
| 4,779,015 | 10/1988 | Erdelyi | 307/475 |

Primary Examiner—Stanley D. Miller
Assistant Examiner—Richard Roseen
Attorney, Agent, or Firm—Skjerven, Morrill, MacPherson, Franklin & Friel

[57] ABSTRACT

The present electrical circuit is capable of coupling operation between other circuits which may have different signal levels, such as small-swing ECL-like signals and large-swing TTL-like signals.

14 Claims, 3 Drawing Sheets

ECL TO TTL CIRCUIT

BACKGROUND OF THE INVENTION

1. Field of the Invention

This invention relates to electrical circuits, and more particularly, to an electrical circuit which is capable of acting as an interface between other circuits which may have different signal and/or power supply levels.

2. Description of the Prior Art

In certain situations, it may be necessary to provide coupling of operation between two circuits which have different signal levels and/or different power supply levels. For example, one circuit may be based on small-swing ECL-like (Emitter Coupled Logic) signals referenced to a positive voltage $V_{cc}$, and that circuit must interface with a circuit providing TTL-like (Transistor-Transistor Logic) signals which have large signal swings that may be referenced to ground. The circuits which provide such interface function are known as translator circuits.

In such translator circuits, it is most important that the output signal therefrom be accurately tied to the input threshold of the following circuit, and that sufficiently high gain be provided.

A commonly used ECL to TTL translator based on bipolar technology is shown in FIG. 1. In the direct current, balanced situation, the voltage at the respective bases of transistor Q1 and Q2 are the same, and nodes 1 and 2 are at the same threshold voltage, i.e., $V_{BE}$ above ground (node 1 being measured through transistor Q3 or transistor Q4, and node 2 being measured through transistor Q5). In such situation, the current through resistor R1 and transistor Q3 on the one hand, and the current through resistor R2 and transistor Q4 on the other hand, are substantially the same.

When a differential input signal (in the form of inverse signals of small swing) is applied to the bases of respective transistors Q1, Q2, this results in the current flowing through resistor R1 being different from the current flowing through resistor R2. However, since the bases of the respective transistors Q3 and Q4 are at the same voltage level, i.e., $V_{BE}$ above ground, substantially identical currents flow through transistors Q3 and Q4. A difference in the current flowing through resistor R2 and transistor Q4 will either inject an excess current into the base of transistor Q5 to saturate transistor Q5, or will pull current from the base of transistor Q5 to turn off transistor Q5, depending on the levels of the signals applied to the respective bases of transistors Q1 and Q2. Through the respective saturation and turning off the trnsistor Q5, a high voltage swing will be obtained at the output lead O/P.

The gallium arsenide-based field effect transistor circuit of FIG. 2 is laid out in a manner generally similar to that of the bipolar circuit of FIG. 1. However, in the case of the circuit of FIG. 2, because of the low threshold voltage of the transistor Q5, fully on transistor Q4 may not be able to fully turn off transistor Q5. In order to ensure that transistor Q5 is off when needed, level shifting is required (FIG. 3), in the form of a diode D1 connected between the source of transistor Q5 and ground along with bleeder transistor Q6 which connects to the voltage supply terminal and to the source of transistor Q5 to insure proper level shifting by the diode D1. While the inclusion of such diode D1 raises the threshold voltage of the following stage including transistor Q5 to ensure that a fully on transistor Q4 will turn the transistor Q5 off, it will be seen that the voltage level at node 1 is different from the voltage level at node 2, at threshold of the stage including Q5 because of the extra diode drop provided by the diode D1. That is, in steady state operation, at threshold voltage of the stage including transistor Q5, node 1 of FIG. 3 is at a voltage of $V_{GS}$ above ground (either through transistor Q3 or transistor Q4), while node 2 is at a threshold voltage $V_{GS}$ (transistor Q5) and one diode drop ($\phi$) above ground. Thus, the input threshold is no longer balanced.

In "OPERATIONAL AMPLIFIERS", Bipolar and MOS Analog Integrated Circuit Design by Alan B. Grebene (published 1984 by John Wiley & Sons, Inc.) a bipolar circuit of general interest is disclosed. However, this circuit does not address the problems described above regard to field effect transistors, and is in fact a linear device implemented, as set forth above, in bipolar technology rather than a digital circuit implemented in field effect transistor technology.

SUMMARY OF THE INVENTION

It is accordingly an object of this invention to provide a translator circuit in compound semiconductor technology such as gallium arsenide technology which is capable of acting as an interface between other circuits which may have different voltage signal and/or power supply levels.

Broadly stated, the invention comprises a translator circuit having an input lead for receiving an input voltage signal, and an output lead for providing an output voltage signal to a logic circuit having a threshold input voltage signal level. The circuit comprises means for receiving a signal of a higher level and a lower level on the input lead and for providing a signal of a higher level and a lower level on the output lead, the signal levels of at least one of the pair of higher level signals and one of the pair of lower level signals being different. Further included are means for providing that an output signal value generally midway between the higher and lower level output signals is substantially matched to the threshold signal level of the logic circuit.

BRIEF DESCRIPTION OF THE DRAWINGS

Other objects of the invention will become apparent from a study of the specification and drawings, in which.

DESCRIPTION OF THE PREFERRED EMBODIMENT

Figure 1:
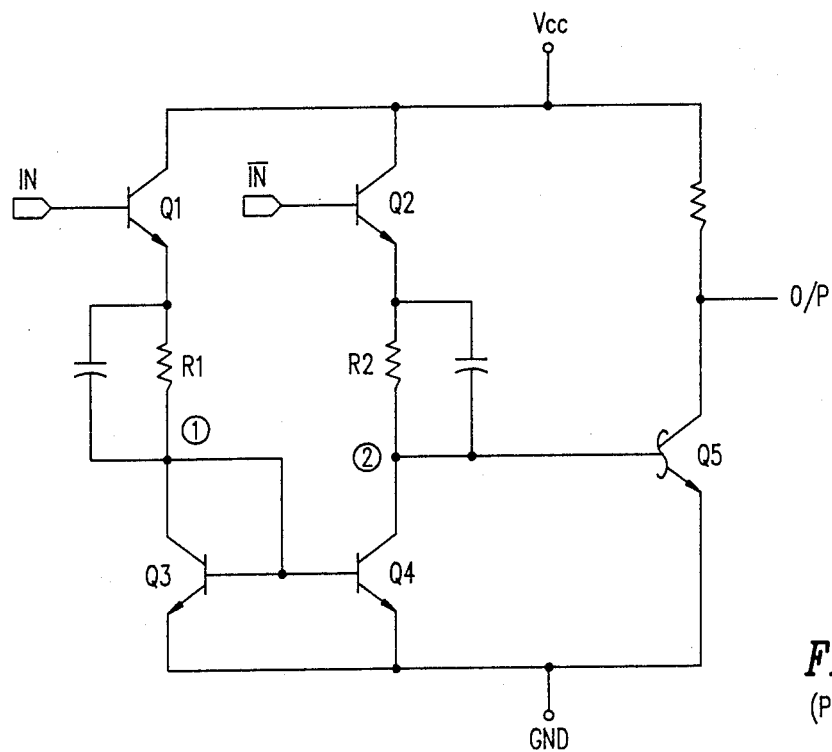
FIG. 1 shows a schematic of a commonly used prior art bipolar translator.
Figure 2:
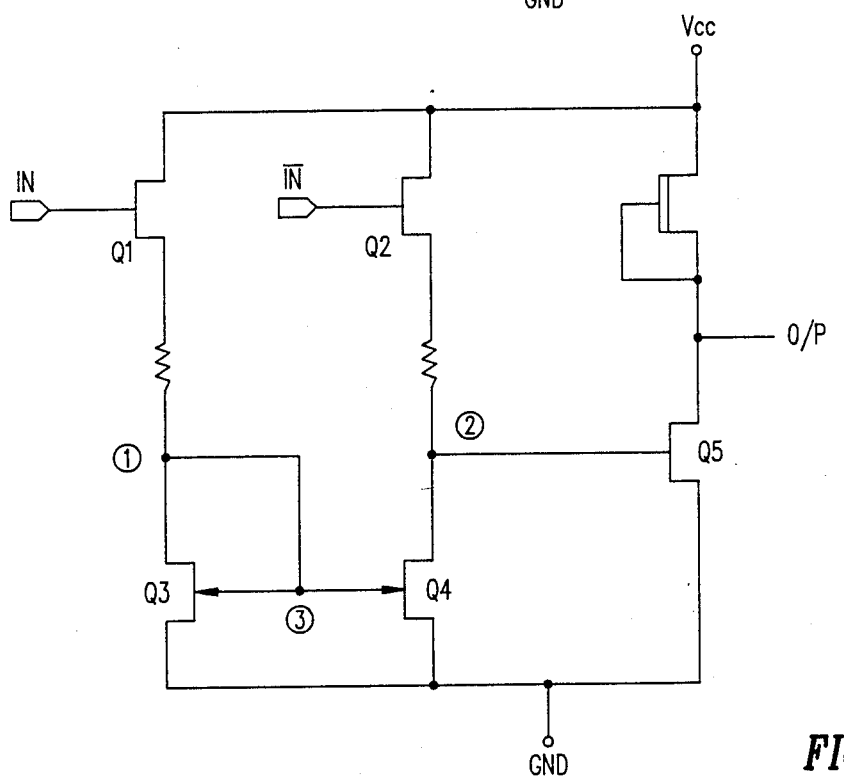
FIG. 2 shows a schematic of a field effect transistor based circuit laid out in a manner generally similar to the circuit of FIG. 1.
Figure 3:
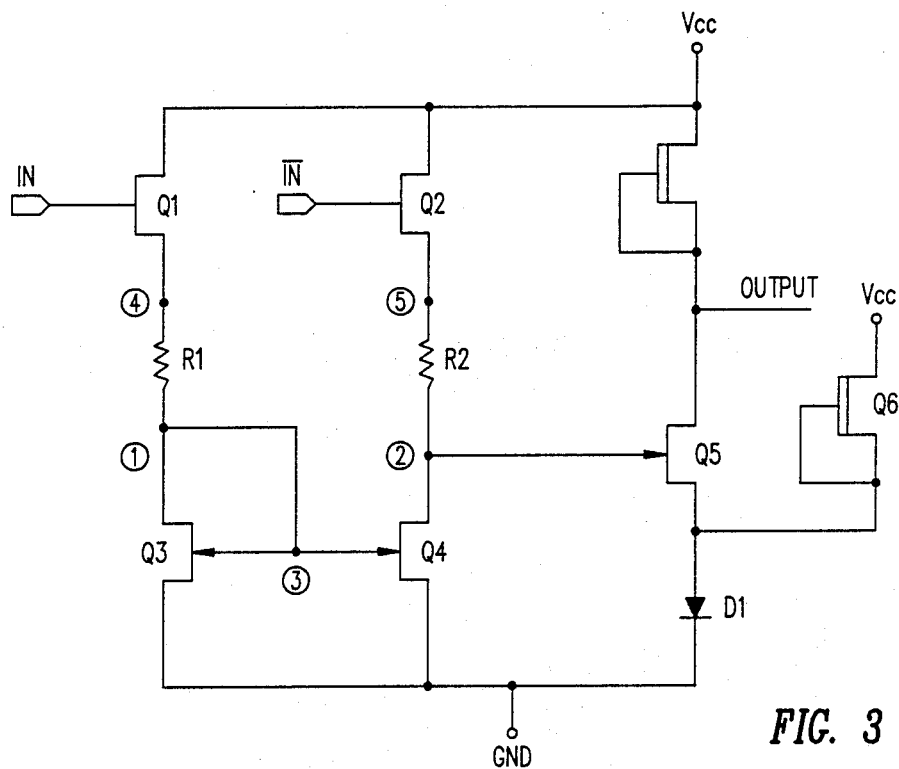
FIG. 3 shows a modification to the circuit of FIG. 2 to ensure that a particular transistor thereof is turned off when needed.
Figure 4A:
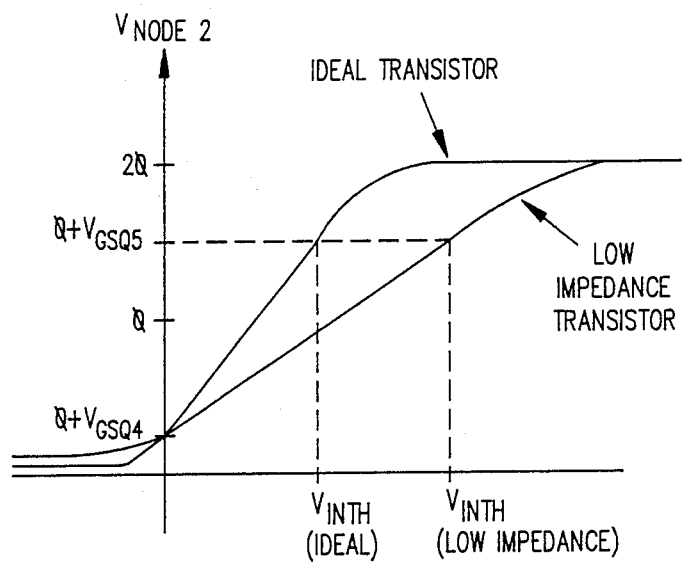
FIGS. 4a and 4b are graphical views showing interplay of certain circuit elements.
Figure 4B:
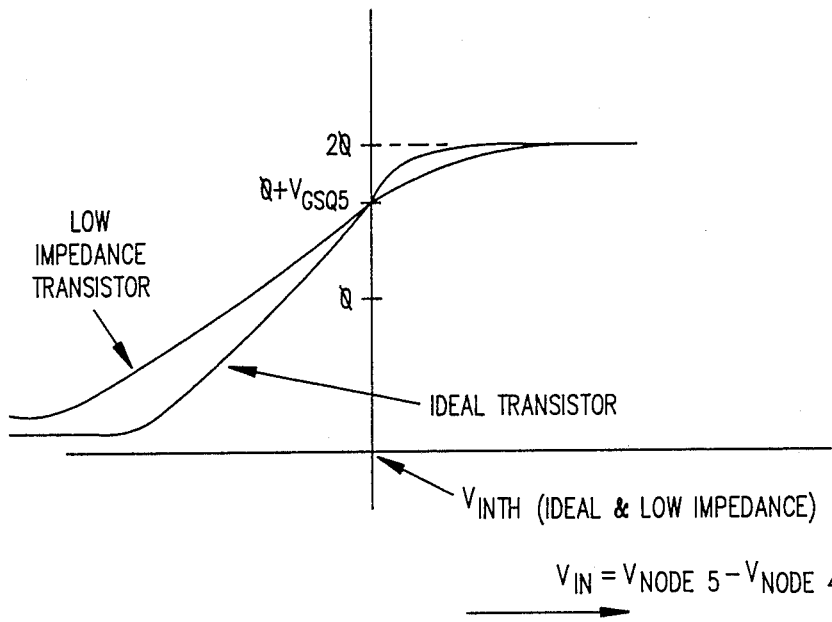

The problem involved above is represented with reference to FIGS. 4a and 4b. Referring first to FIG. 4a, with the threshold voltage needed at transistor Q5 being $V_{GS}$ of Q5 plus $\phi$, the voltage difference between nodes 5 and 4 must reach a value of $\phi$ just to bring the stage including transistor Q5 to threshold, assuming ideal transistor operation. Thus, an even higher voltage swing will be needed in order to ensure transistor Q5 fully turns on. This is because of the increase in input threshold voltage of the stage including transistor Q5 due to the addition of diode D1. Furthermore, the voltage difference between node 5 and node 4 required to bring the stage including transistor Q5 to threshold will be even greater for low output impedance transistors Q3 and Q4. As will be described in detail, by including a diode between node 1 and node 3 (FIG. 3) forward biased in the direction from the voltage supply terminal at higher potential to the voltage supply terminal at lower potential, node 1 is raised to a threshold level of $V_{GS}$ for transistor Q4+$\phi$. Thus, the vertical axis of zero for the voltage difference applied between node 5 and node 4 shifts to the right (FIG. 4b), being shifted up one diode level $\phi$ so that the signal swing necessary to, for example, reach the threshold voltage of the stage including transistor Q5 is at much less than previous, meaning that small signals of ECL nature can be translated to large signals of TTL nature in a readily efficient manner. Furthermore, the voltage difference between node 5 and node 4 required to bring the stage including transistor Q5 to threshold no longer depends on the output impedance of the transistors Q3 and Q4 and is substantially zero.

Figure 5:
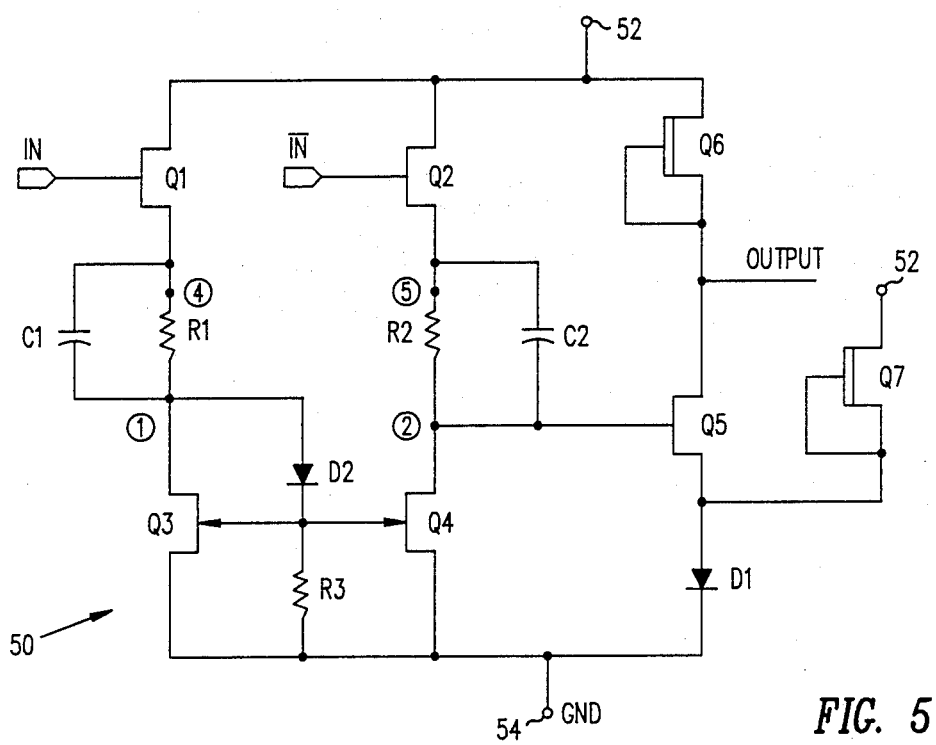
FIG. 5 is a schematic view of the circuit incorporating the present invention.

The detailed embodiment of the invention is indicated at FIG. 5. As shown therein, the translator circuit 50 includes a first voltage supply terminal 52 which is in fact a positive voltage supply terminal, and a second voltage supply terminal 54 which is in this embodiment a ground terminal. The circuit includes an enhancement mode field effect transistor Q1 having its drain connected to the voltage supply terminal 52, and its source connected to a capacitor C1 and resistor R1 in parallel which join at node 1. Node 1 is also connected to the drain of low impedance enhancement mode field effect transistor Q3, which has its source connected to the ground terminal 54.

Similarly, a low impedance enhancement mode field effect transistor Q2 has its drain connected to the voltage supply terminal 52, and its source connected to a resistor R2 and capacitor C2 in parallel, together joined at node 2. Node 2 is further connected to drain of enhancement mode field effect transistor Q4, while the source of transistor Q4 is connected to ground terminal 54. The gates of the transistors Q3 and Q4 are connected together by a conductor.

A level shifter in the form of a diode D2, forward biased in a direction from the voltage supply terminal 12 to ground terminal 54, connects to the drain of transistor Q3 and the gates of transistors Q3, Q4. A resistor R3 connects the gates of transistors Q3 and Q4 to ground terminal 54.

A depletion mode field effect transistor Q6 has its drain connected to the voltage supply terminal 52, and its source connected to its gate, to act as a load device. The source of transistor Q6 is connected to the drain of enhancement mode field effect transistor Q5, which has its source connected to a level shifter in the form of a diode D1 in turn connected to ground terminal 54, with the diode D1 forward biased in the direction from the voltage supply terminal 52 toward the voltage supply terminal 54. A depletion mode field effect transistor Q7 has its drain connected to the voltage supply terminal 52, and its source connected to its gate to act as a bleeder. The source of Q7 is connected to the source of Q5. Node 2 is connected to the gate of transistor Q5.

An output signal is taken from the drain of transistor Q5, while complimentary inverse (differential) input signals are provided to the gates of transistors Q1 and Q2.

The circuit portion Q6, Q5, D1 may be considered to be part of a logic circuit with which the translator circuit is operatively associated.

The entire circuit is implemented in compound semiconductor technology, and in this particular example, in gallium arsenide technology.

In operation, the signal levels applied to the gates of transistors Q1, Q2 are of relative higher and lower levels, while the output signal levels needed are also at relative higher and lower levels. However, as described above, the corresponding higher levels of this signals can be quite different, as can the corresponding lower levels, as in the case where the input signals are ECL-like signals and the output signals are TTL-like signals.

With complimentary signals being applied to the gates of the respective transistors Q1 and Q2, with the threshold voltage of the stage including transistor Q5 being $V_{GS}+\phi$, node 1 is also at the state above ground of $V_{GS}$(transistor Q4)+$\phi$, the resistor R3 being sized to ensure that the diode D2 continuously conducts. With such a voltage drop above ground being provided in both cases, the zero vertical axis of FIG. 4 shifts to the right as described above resulting in the fact that the operation of transistor Q5 is responsive to smaller $V_{in}$ signal swings than if the diode D2 were not in place. That is, the output signal value taken at node 2 generally midway between its higher and lower level levels (in fact being substantially the average of those higher and lower levels) is substantially matched to the threshold signal level of the logic circuit of which transistor Q5, Q6, diode D1, and bleeder transistor Q7 are a part.

We claim:

1. A translator circuit having an input signal lead for receiving an input signal, an output signal lead for providing an output signal, a first voltage supply terminal, a second voltage supply terminal, and first and second input transistors connected to the voltage supply terminal, the input signal lead being connected to either input transistor, the translator circuit comprising:

first load means connected to the first input transistor;
a first transistor having a first current handling terminal connected to the first load means, a current control terminal, and a second current handling terminal connected to the second voltage supply terminal;
second load means connected to the second input transistor;
a second transistor having a first current handling terminal connected to the second load means, a current control terminal, and a second current handling terminal connected to the second voltage supply terminal;
the current control terminal of the first transistor being connected to the current control terminal of the second transistor;
level shifter means connected to the first current handling terminal of the first transistor and the current control terminal of the first transistor;
third load means connected to the current control terminal of the first transistor and the second voltage supply terminal;
the output signal lead being connected to the first current handling terminal of the second transistor.

2. The circuit of claim 1 wherein the level shifter means comprise a diode forward biased in the direction from the first voltage supply terminal to the second voltage supply terminal.

3. The circuit of claim 1 wherein the first and second transistors are low impedance transistors.

4. The circuit of claim 1 wherein the transistors are field effect transistors.

5. The circuit of claim 1 wherein the transistors are implemented in compound semiconductor technology.

6. The circuit of claim 5 wherein the transistors are implemented in gallium arsenide technology.

7. The circuit of claim 6 wherein the transistors are field effect transistors.

8. The circuit of claim 1 and further comprising a third transistor providing the connection between the first voltage supply terminal and the first load means, and a fourth transistor providing the connection between the first voltage supply terminal and the second load means, the third and fourth transistors having respective current control terminals to which differential input signals are provided.

9. The circuit of claim 8 wherein the level shifter means comprise a diode forward biased in the direction from the first voltage supply terminal to the second voltage supply terminal.

10. The circuit of claim 8 wherein the first and second transistors on low impedance transistors.

11. The circuit of claim 8 wherein the transistors are field effect transistors.

12. The circuit of claim 8 wherein the transistors are implemented in compound semiconductor technology.

13. The circuit of claim 12 wherein the transistors are implemented in gallium arsenide technology.

14. The circuit of any of claims 1, 2, 3, 4, 5, 6, 7, 8, 9, 10, 11, 12, or 13 wherein the third load means comprise a resistor.

* * * * *